(12) United States Patent
Uejima et al.

(10) Patent No.: US 8,466,733 B2
(45) Date of Patent: Jun. 18, 2013

(54) HIGH-FREQUENCY SWITCH MODULE

(75) Inventors: Takanori Uejima, Nagaokakyo (JP);
Hisanori Murase, Nagaokakyo (JP)

(73) Assignee: Murata Manufacturing Co., Ltd.,
Kyoto (JP)

( * ) Notice: Subject to any disclaimer, the term of this patent is extended or adjusted under 35 U.S.C. 154(b) by 216 days.

(21) Appl. No.: 12/889,456

(22) Filed: Sep. 24, 2010

(65) Prior Publication Data

US 2011/0234295 A1 Sep. 29, 2011

(30) Foreign Application Priority Data

Sep. 29, 2009 (JP) ................. 2009-225537

(51) Int. Cl.
*H03K 17/00* (2006.01)

(52) U.S. Cl.
USPC ............................ 327/365; 327/407; 327/427

(58) Field of Classification Search
USPC ................. 327/374, 472, 365, 376, 377, 427, 327/407
See application file for complete search history.

(56) References Cited

U.S. PATENT DOCUMENTS

| | | | |
|---|---|---|---|
| 7,328,041 B2 * | 2/2008 | Tasaka | 455/552.1 |
| 2004/0203552 A1 * | 10/2004 | Horiuchi et al. | 455/333 |
| 2004/0266378 A1 | 12/2004 | Fukamachi et al. | |
| 2005/0059358 A1 | 3/2005 | Block et al. | |
| 2005/0079828 A1 | 4/2005 | Tasaka | |
| 2005/0219010 A1 | 10/2005 | Erb | |
| 2007/0085754 A1 | 4/2007 | Ella et al. | |

FOREIGN PATENT DOCUMENTS

| | | |
|---|---|---|
| JP | 04-163906 A | 6/1992 |
| JP | 09-098046 A | 4/1997 |
| JP | 9-181641 A | 7/1997 |
| JP | 2001-189677 A | 7/2001 |
| JP | 2003-124702 A | 4/2003 |
| JP | 2004-253953 A | 9/2004 |
| JP | 2005-505186 A | 2/2005 |
| JP | 2005-123740 A | 5/2005 |
| JP | 2005-244286 A | 9/2005 |
| JP | 2005-287046 A | 10/2005 |
| JP | 2008-519534 A | 6/2008 |
| JP | 4224802 B2 | 2/2009 |
| WO | 2006/052766 A1 | 5/2006 |
| WO | 2009/069353 A1 | 6/2009 |

OTHER PUBLICATIONS

Official Communication issued in corresponding European Patent Application No. 10174201.3, mailed on Jan. 24, 2012.
Official Communication issued in corresponding Japanese Patent Application No. 2009-225537, mailed on May 22, 2011.
Official Communication issued in corresponding European Patent Application No. 10174201.3, mailed on Jul. 12, 2012.
Official Communication issued in corresponding Japanese Patent Application No. 2009-225537, mailed on Nov. 29, 2011.

* cited by examiner

*Primary Examiner* — Hai L Nguyen
(74) *Attorney, Agent, or Firm* — Keating & Bennett, LLP

(57) ABSTRACT

A high-frequency switch module includes a switch IC. An impedance matching circuit is connected to the antenna port of the switch IC. The impedance matching circuit includes a high-pass filter and a low-pass filter. The high-pass filter is disposed on the side of the antenna port, and is a substantially L-shaped circuit including a capacitor and an inductor. The antenna port is connected to the ground by the inductor.

7 Claims, 7 Drawing Sheets

HIGH-FREQUENCY SWITCH MODULE

BACKGROUND OF THE INVENTION

1. Field of the Invention

The present invention relates to a high-frequency switch module arranged to switch among various high-frequency signals to be transmitted or received.

2. Description of the Related Art

Various high-frequency switch modules for transmitting/receiving a plurality of communication signals in different frequency bands with a single antenna have been recently developed. In such a high-frequency switch module, an SPnT (n represents a positive number) switch IC is generally used. The SPnT switch IC includes an antenna connection port connected to an antenna and a plurality of high-frequency signal input/output ports (including a transmission port, a reception port, and a transmission/reception port.) Switching among the high-frequency signal input/output ports to be connected to the antenna connection port is performed in accordance with a control signal.

In high-frequency switch modules in the related art, a matching circuit for performing impedance matching between a switch IC and an antenna is connected to an antenna connection port of the switch IC. For example, in a high-frequency switch module disclosed in Japanese Unexamined Patent Application Publication No. 2005-505186, a π-type band-pass filter is connected between an antenna connection port and an antenna.

This π-type band-pass filter includes an LC series resonance circuit connected between the antenna connection port of a switch IC and the antenna and two LC parallel resonance circuits for connecting both ends of the LC series resonance circuit to the ground. Furthermore, a capacitor connected in series to the LC series resonance circuit is disposed on the sides of the antenna connection port and the antenna.

The π-type band-pass filter functions not only as an impedance matching circuit but also as an electrostatic discharge (ESD) protection circuit.

A switch IC in such a high-frequency switch module includes an FET and a capacitor. At the time of energization, an electric charge is stored in the FET and the capacitor. When switching control is performed in this state, the switching control is not completed until the stored electric charge is discharged. That is, high-speed discharging is required for high-speed switching.

However, since the capacitor is directly connected to the antenna connection port in the above-described high-frequency switch modules in the related art, it is difficult for an electric charge stored in the switch IC to discharge and a discharge time is increased. This leads to the reduction in a switching speed.

SUMMARY OF THE INVENTION

Preferred embodiments of the present invention provide a high-frequency switch module that quickly discharges an electric charge stored in a switch IC and achieves high-speed switching.

A high-frequency switch module according to a preferred embodiment of the present invention includes a switch IC including a common terminal connected to a single antenna and a plurality of high-frequency signal input/output terminals that are individually connected to a plurality of high-frequency communication circuits and a first inductor arranged to directly connect the common terminal of the switch IC to a ground.

Since only an inductor is connected between the common terminal of the switch IC and the ground, an electric charge stored in the switch IC is quickly discharged from the common terminal to the ground via the inductor. As a result, a switching speed is increased.

The high-frequency switch module further includes a second inductor arranged to directly connect at least one of the high-frequency signal input/output terminals to the ground.

Like in the case of the common terminal, high-speed discharging is achieved via the high-frequency signal input/output terminals of the switch IC. As a result, higher-speed discharging and higher-speed switching can be achieved.

The high-frequency switch module further includes an impedance matching circuit that is disposed between the common terminal of the switch IC and the antenna and is arranged to perform impedance matching between the switch IC and the antenna. The first inductor is disposed at one end portion of the impedance matching circuit on a side of the common terminal.

Since the inductor used for high-speed discharging is included in the impedance matching circuit connected to the common terminal of the switch IC, the impedance matching circuit can have an impedance matching function and a high-speed discharging function. As compared with a case in which an impedance matching circuit and a high-speed discharging circuit are separately disposed, the size of a high-frequency switch module can be reduced.

In the high-frequency switch module, the impedance matching circuit preferably includes a band-pass filter including a low-pass filter and a high-pass filter and the first inductor is used in the high-pass filter.

Since the impedance matching circuit includes the low-pass filter and the high-pass filter, impedance matching can be performed in a wider frequency band as compared with a case in which an impedance matching circuit includes either of a low-pass filter and a high-pass filter. An inductor (a shunt inductor) arranged to connect a signal line and the ground is included in a high-pass filter. Since the shunt inductor is used as the first inductor used for high-speed discharging, it is possible to provide a high-frequency switch module capable of having an excellent transmission characteristic in a wide frequency band and achieving high-speed discharging and high-speed switching.

The high-frequency switch module further includes a multilayer circuit board in which the switch IC is located and a circuit element included in the impedance matching circuit includes an internal electrode or a mounted electronic circuit component. One end portion of the first inductor on a side of the ground is connected to a ground electrode disposed on an inner layer or undersurface of the multilayer circuit board through only via holes formed in the multilayer circuit board.

Since the terminal of the first inductor on the side of the ground is directly connected to the ground through only via holes without passing through other circuit electrode patterns in the multilayer circuit board, a discharging speed can be further increased.

In the high-frequency switch module, one end portion of the second inductor on a side of the ground is connected to the ground electrode through only the via holes formed in the multilayer circuit board.

Since the second inductor is directly connected to the ground through only via holes like the first inductor, a discharging speed can be increased.

In the high-frequency switch module, the second inductor is mounted on a surface of the multilayer circuit board.

Since the second inductor is mounted on the surface of the multilayer circuit board, the degree of isolation between the second inductor and each circuit pattern on the side of the high-frequency signal input/output terminals of the switch IC included in the multilayer circuit board can be increased.

In the high-frequency switch module, the first inductor is mounted on the surface of the multilayer circuit board and other circuit elements included in the high-frequency switch module are disposed between the first inductor and the second inductor on the surface of the multilayer circuit board.

Since the first inductor is mounted on the surface of the multilayer circuit board, an inductor having a high resistance to a current and a desired inductance can be easily selected as the first inductor and design flexibility is improved. Furthermore, since other elements are disposed between the first inductor and the second inductor on the surface of the multilayer circuit board, the isolation between a common terminal side of the switch IC and a high-frequency signal input/output terminal side of the switch IC can be established. As a result, it is possible to prevent static electricity noise transmitted from an antenna to leak into the high-frequency signal input/output terminal side.

In the high-frequency switch module, the impedance matching circuit includes a capacitor having one end portion connected to the ground and a counter electrode of the capacitor is sandwiched between two ground electrodes included in the multilayer circuit board in a lamination direction.

Since the capacitor included in the impedance matching circuit is sandwiched between the ground electrodes included in the multilayer circuit board, the isolation between the capacitor and each circuit pattern on the side of the high-frequency signal input/output terminals included in the multilayer circuit board can be established. As a result, it is possible to prevent noise transmitted to the impedance matching circuit from leaking into the high-frequency signal input/output terminal side.

According to a preferred embodiment of the present invention, it is possible to quickly discharge an electric charge stored in a switch IC to the ground at the time of switching with an inductor to direct connecting the switch IC and the ground. A high-frequency switch module capable of performing high-speed switching can be therefore provided.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
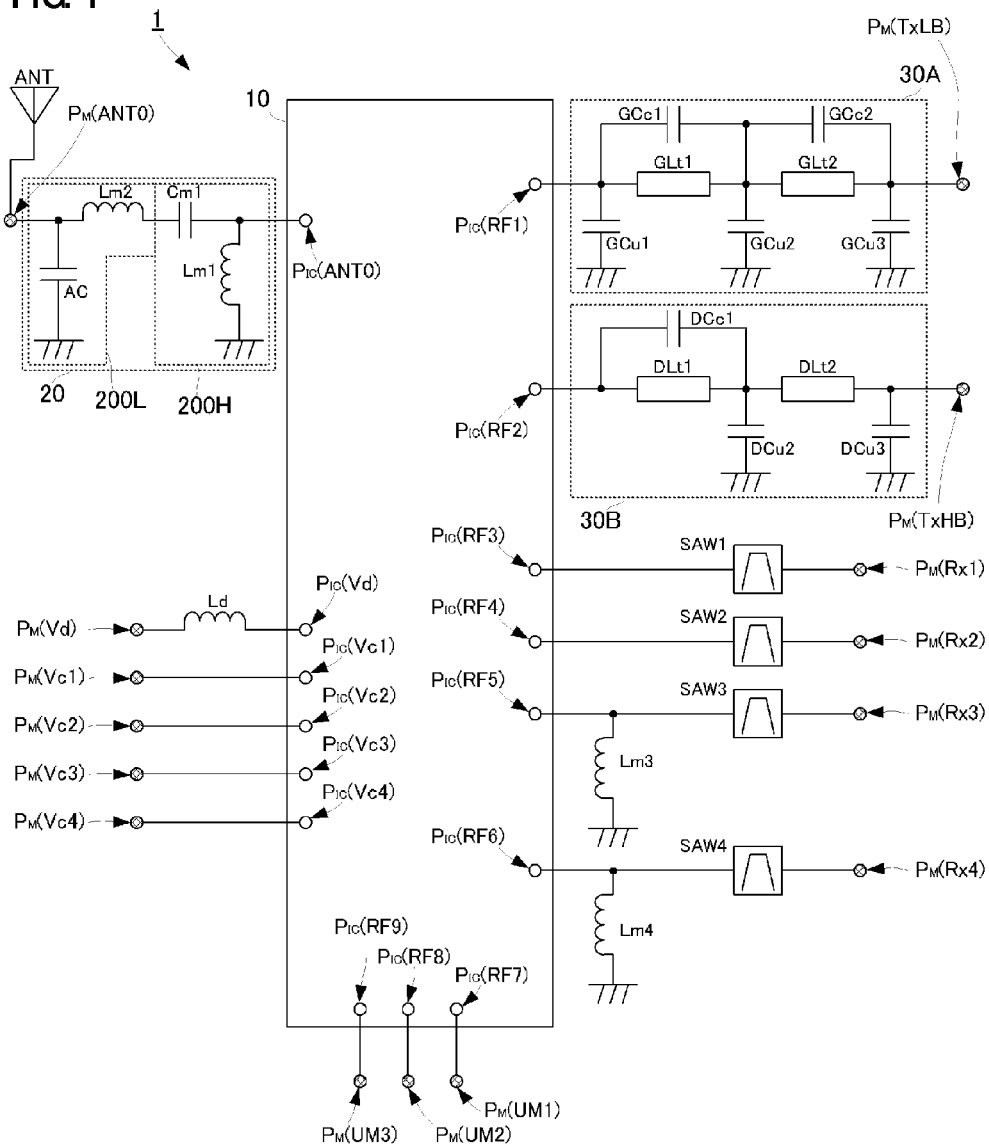
FIG. 1 is a circuit diagram of a high-frequency switch module according to a first preferred embodiment of the present invention.
Figure 2:
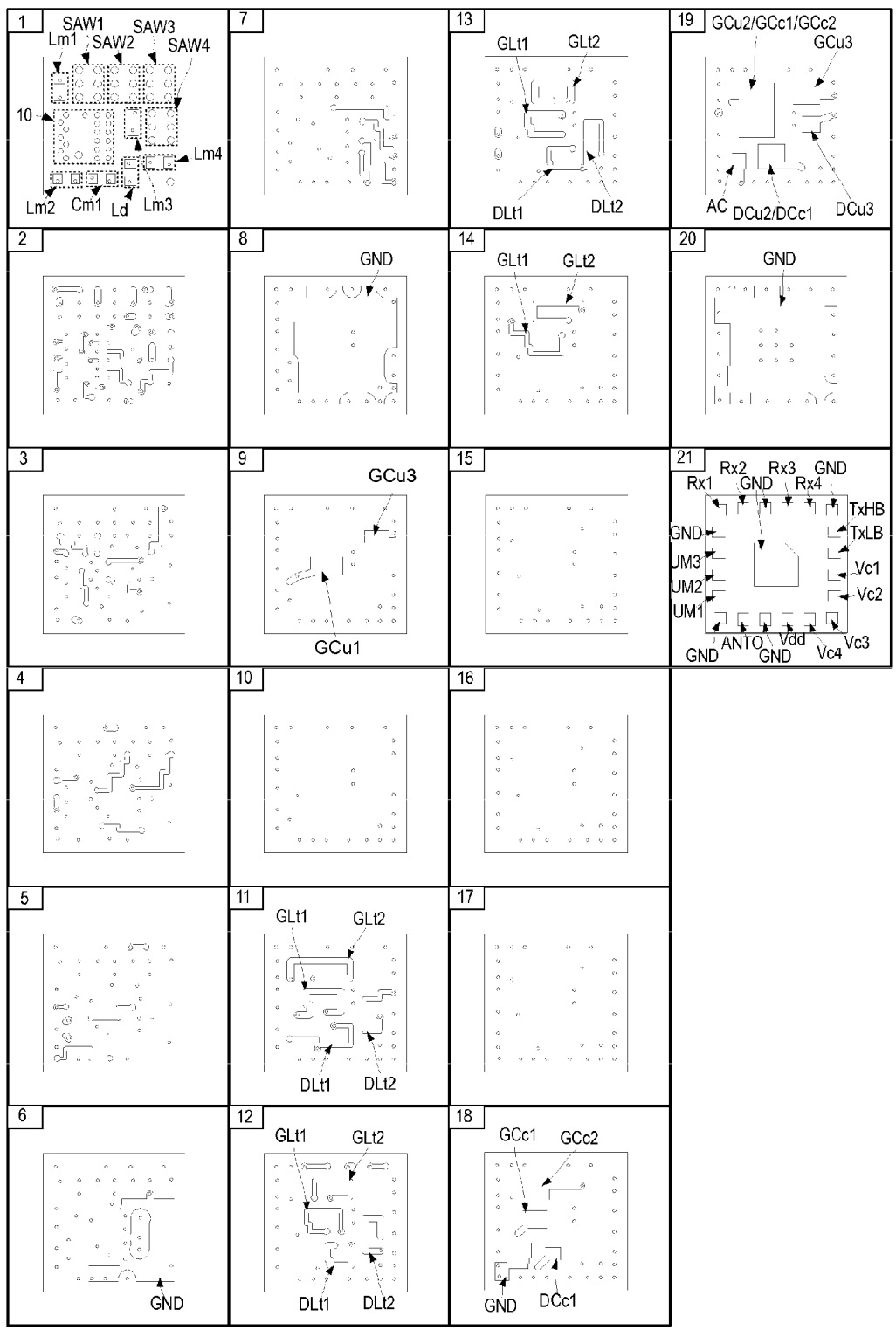
FIG. 2 is a lamination diagram of a high-frequency switch module according to the first preferred embodiment of the present invention.

A high-frequency switch module according to a first preferred embodiment of the present invention will be described with reference to the accompanying drawings. FIG. 1 is a circuit diagram of a high-frequency switch module 1 according to the first preferred embodiment. FIG. 2 is a lamination diagram of a multilayer circuit board in the high-frequency switch module 1.

A multilayer circuit board in the high-frequency switch module 1, whose configuration will be described in detail later with reference to FIG. 2, includes a stack of a plurality of dielectric layers made of ceramic or a resin. Circuit patterns other than a switch IC 10, inductors Lm1, Lm2, Lm3, Lm4, and Ld, a capacitor Cm1, and SAW filters SAW1, SAW2, SAW3, and SAW4 in the switch IC 10 illustrated in FIG. 1 are created by forming electrodes of predetermined patterns in inner layers between the dielectric layers and the top and bottom surfaces of the stack.

The high-frequency switch module 1 includes a plurality of external-connection electrodes $P_M$ with which the high-frequency switch module 1 is mounted on a circuit board for a circuit at the subsequent stage. In the following description, for the convenience of explanation, the external-connection electrode $P_M$ of the high-frequency switch module 1 is referred to as an "electrode", and a mount electrode $P_{IC}$ of the switch IC 10 to be described later is referred to as a "port."

The external-connection electrodes $P_M$ include an external antenna electrode $P_M(ANT0)$, external transmission electrodes $P_M(TxLB)$ and $P_M(TxHB)$, external reception electrodes $P_M(Rx1)$, $P_M(Rx2)$, $P_M(Rx3)$, and $P_M(Rx4)$, external transmission/reception electrodes $P_M(UM1)$, $P_M(UM2)$, and $P_M(UM3)$, an external drive voltage input electrode $P_M(Vd)$ arranged to input a drive voltage, and external control voltage input electrodes $P_M(Vc1)$, $P_M(Vc2)$, $P_M(Vc3)$, and $P_M(Vc4)$ arranged to input a control voltage signal. Although not illustrated in FIG. 1, the external-connection electrodes $P_M$ also include a ground electrode.

First, the configuration of the high-frequency switch module 1 between an antenna and the switch IC 10 will be described.

An antenna port $P_{IC}(ANT0)$ of the switch IC 10 having a CMOS structure is connected via an impedance matching circuit 20 to the external antenna electrode $P_M(ANT0)$ of the high-frequency switch module 1 connected to an antenna ANT.

In the impedance matching circuit 20, a low-pass filter 200L and a high-pass filter 200H are connected in series between the external antenna electrode $P_M(ANT0)$ and the antenna port $P_{IC}(ANT0)$.) The low-pass filter 200L is connected to the external antenna electrode $P_M(ANT0)$, and the high-pass filter 200H is connected to the antenna port $P_{IC}(ANT0)$.)

The low-pass filter 200L includes the inductor Lm2 and a capacitor AC. One end of the inductor Lm2 is connected to the external antenna electrode $P_M(ANT0)$, and the other end of the inductor Lm2 is connected to the capacitor Cm1 in the high-pass filter 200H. One end of the capacitor AC is connected to the external antenna electrode $P_M(ANT0)$, and the other end of the capacitor AC is connected to the ground.

The high-pass filter 200H includes the capacitor Cm1 and the inductor Lm1 (corresponding to a first inductor according to a preferred embodiment of the present invention.) One end of the capacitor Cm1 is connected to the inductor Lm2 in the low-pass filter 200L, and the other end of the capacitor Cm1 is connected to the antenna port $P_{IC}(ANT0)$ of the switch IC 10. One end of the inductor Lm1 is connected to the antenna port $P_{IC}(ANT0)$, and the other end of the inductor Lm1 is connected to the ground.

The impedance matching circuit 20 functions as a band-pass filter including the low-pass filter 200L and the high-pass filter 200H by appropriately setting the inductances of the inductors Lm1 and Lm2 and the capacitances of the capacitors Cm1 and AC. As compared with a case in which only a low-pass or high-pass filter is used, impedance matching can be performed in a wider frequency band. For example, when only a low-pass filter is used, impedance matching is performed in only frequency bands for GSM (global system for mobile communications)-850 and GSM-900. When only a high-pass filter is used, impedance matching is performed in only frequency bands for GSM-1800 and GSM-1900. By using a band-pass filter including a high-pass filter and a low-pass filter, impedance matching can be performed in all of frequency bands for GSM-850, GSM-900, GSM-1800, and GSM-1900. Consequently, a high-frequency switch module according to a preferred embodiment of the present invention which is capable of switching signals in four frequency bands or more to be transmitted/received to/from a single antenna and achieving excellent transmission characteristics in all of the frequency bands can be obtained.

Since a signal line is connected to the ground by the inductor Lm1, even if static electricity noise from the antenna ANT is surged, a current generated by the surged noise is discharged from the inductor Lm1 to the ground. Thus, the impedance matching circuit 20 also functions as an ESD protection device and can prevent the switch IC 10 from being destroyed by static electricity.

Since the antenna port $P_{IC}(ANT0)$ of the switch IC 10 is directly connected to the ground by the inductor Lm1, static electricity charged in the switch IC 10 can be quickly discharged to the ground via the inductor Lm1. As a result, high-speed switching can be achieved.

For example, it is assumed that a switch IC having the same CMOS structure is used, the inductance of the inductor Lm1 is approximately 22 nH, and a capacitor having a capacitance of approximately 10 pF is disposed between the inductor Lm1 and the antenna port $P_{IC}(ANT0)$.) In this case, a switching speed is approximately 81.6 μsec. On the other hand, in the case of a circuit according to a preferred embodiment of the present invention, a switching speed is approximately 1.2 μsec for example.

Thus, when the impedance matching circuit 20 according to a preferred embodiment of the present invention is used, it is possible to achieve impedance matching between a switch IC and an antenna in a wide frequency band, ESD protection, and a high-speed switching in the switch IC with a simple configuration.

Next, the configuration of the switch IC 10 will be described.

The switch IC 10 has, for example, a CMOS structure, and is an SP9T-type FET switch IC that is substantially rectangular in plan view. The switch IC 10 is driven by a drive voltage Vdd, and has a function of selectively connecting the antenna port $P_{IC}(ANT0)$ corresponding to a common terminal according to a preferred embodiment of the present invention to one of communication ports $P_{IC}(RF1)$ to $P_{IC}(RF9)$ corresponding to high-frequency signal input/output terminals according to a preferred embodiment of the present invention in accordance with the combination of control voltage signals Vc1 to Vc4. In this preferred embodiment, an SP9T-type switch IC is used. However, an SPnT-type (n represents a positive number equal to or larger than two) may be used.

Next, the circuit configuration of the high-frequency switch module 1 on the opposite side of the antenna, that is, on the side of the communication ports of the switch IC 10 corresponding to high-frequency signal input/output terminals according to a preferred embodiment of the present invention will be described.

The communication port $P_{IC}(RF1)$ of the switch IC 10 is connected to the external transmission electrode $P_M(TxLB)$ via a low-pass filter 30A in the high-frequency switch module 1.

The low-pass filter 30A includes inductors GLt1 and GLt2 and capacitors GCu1, GCu2, GCu3, GCc1, and GCc2.

The inductors GLt1 and GLt2 are connected in series between the external transmission electrode $P_M(TxLB)$ and the communication port $P_{IC}(RF1)$.) The capacitor GCc1 is connected in parallel to the inductor GLt1, and the capacitor GCc2 is connected in parallel to the inductor GLt2. The capacitor GCu1 is connected between one end of the inductor GLt1 on the side of the communication port $P_{IC}(RF1)$ and the ground. The capacitor GCu2 is connected between a node between the inductors GLt1 and GLt2 and the ground. The capacitor GCu3 is connected between one end of the inductor GLt2 on the side of the external transmission electrode $P_M(TxLB)$ and the ground.

The element values of the inductors and the capacitors included in the low-pass filter 30A are set so that the frequency band of a transmission signal input from the external transmission electrode $P_M(TxLB)$ becomes a passband and a higher-order harmonic of the transmission signal is attenuated. For example, the element values of the inductors and the capacitors included in the low-pass filter 30A are set so that the frequency band of a GSM-850 or GSM-900 transmission signal becomes a passband and the frequency band of a double or triple harmonic of the GSM-850 or GSM-900 transmission signal becomes an attenuation band.

The communication port $P_{IC}(RF2)$ of the switch IC 10 is connected to the external transmission electrode $P_M(TxHB)$ via a low-pass filter 30B in the high-frequency switch module 1.

The low-pass filter 30B includes inductors DLt1 and DLt2 and capacitors DCu2, DCu3, and DCc1.

The inductors DLt1 and DLt2 are connected in series between the external transmission electrode $P_M(TxHB)$ and the communication port $P_{IC}(RF2)$.) The capacitor DCc1 is connected in parallel to the inductor DLt1. The capacitor DCu2 is connected between a node between the inductors DLt1 and DLt2 and the ground. The capacitor DCu3 is connected between one end of the inductor DLt2 on the side of the external transmission electrode $P_M(TxHB)$ and the ground.

The element values of the inductors and the capacitors included in the low-pass filter 30B are set so that the frequency band of a transmission signal input from the external transmission electrode $P_M(TxHB)$ becomes a passband and a higher-order harmonic of the transmission signal is attenuated. For example, the element values of the inductors and the capacitors included in the low-pass filter 30B are set so that the frequency band of a GSM-1800 or GSM-1900 transmission signal becomes a passband and the frequency band of a double or triple harmonic of the GSM-1800 or GSM-1900 transmission signal becomes an attenuation band.

The communication port $P_{IC}(RF3)$ of the switch IC 10 is connected to the external reception electrode $P_M(Rx1)$ via the SAW filter SAW1 in the high-frequency switch module 1. The SAW filter SAW1 is a filter having a first reception frequency band as a passband. For example, the frequency band of a GSM-850 reception signal is set as a passband of the SAW filter SAW1.

The communication port $P_{IC}$(RF4) of the switch IC 10 is connected to the external reception electrode $P_M$(Rx2) via the SAW filter SAW2 in the high-frequency switch module 1. The SAW filter SAW2 is a filter having a second reception frequency band as a passband. For example, the frequency band of a GSM-900 reception signal is set as a passband of the SAW filter SAW2.

The communication port $P_{IC}$(RF5) of the switch IC 10 is connected to the external reception electrode $P_M$(Rx3) via the SAW filter SAW3 in the high-frequency switch module 1. The SAW filter SAW3 is a filter having a third reception frequency band as a passband. For example, the frequency band of a GSM-1800 reception signal is set as a passband of the SAW filter SAW3. Furthermore, the communication port $P_{IC}$(RF5) of the switch IC 10 is connected to the ground by the inductor Lm3 (corresponding to a second inductor according to a preferred embodiment of the present invention.) Since the communication port $P_{IC}$(RF5) is directly connected to the ground by the inductor Lm3, the inductor Lm3 can quickly discharge static electricity charged in the switch IC 10 to the ground at the time of switching like the inductor Lm1 disposed on the side of the antenna port $P_{IC}$(ANT0.) As a result, higher-speed switching can be achieved.

The communication port $P_{IC}$(RF6) of the switch IC 10 is connected to the external reception electrode $P_M$(Rx4) via the SAW filter SAW4 in the high-frequency switch module 1. The SAW filter SAW4 is a filter having a fourth reception frequency band as a passband. For example, the frequency band of a GSM-1900 reception signal is set as a passband of the SAW filter SAW4. Furthermore, the communication port $P_{IC}$(RF6) of the switch IC 10 is connected to the ground by the inductor Lm4 (corresponding to the second inductor according to a preferred embodiment of the present invention.) Since the communication port $P_{IC}$(RF6) is directly connected to the ground by the inductor Lm4, the inductor Lm4 can quickly discharge static electricity charged in the switch IC 10 to the ground at the time of switching like the inductor Lm1 disposed on the side of the antenna port $P_{IC}$(ANT0) and the inductor Lm3 connected to the communication port $P_{IC}$(RF5.) As a result, higher-speed switching can be achieved.

The communication ports $P_{IC}$(RF7), $P_{IC}$(RF8), and $P_{IC}$(RF9) of the switch IC 10 are connected to the external transmission/reception electrodes $P_M$(UM1), $P_M$(UM2), and $P_M$(UM3), respectively, in the high-frequency switch module 1.

The drive voltage input port $P_{IC}$(Vd) of the switch IC is connected to the external drive voltage input electrode $P_M$(Vd) via the inductor Ld that is a choke coil in the high-frequency switch module 1.

The control voltage input ports $P_{IC}$(Vc1), $P_{IC}$(Vc2), $P_{IC}$(Vc3), and $P_{IC}$(Vc4) of the switch IC 10 are connected to the external control voltage input electrodes $P_M$(Vc1), $P_M$(Vc2), $P_M$(Vc3), and $P_M$(Vc4), respectively, in the high-frequency switch module 1.

Next, the lamination configuration of a multilayer circuit board in the high-frequency switch module 1 will be described in detail below with reference to FIG. 2.

In a multilayer circuit board in the high-frequency switch module 1, the low-pass filters 30A and 30B are preferably defined internal electrode patterns. Other circuit elements mounted on the surface of the multilayer circuit board and a circuit pattern so as to connect each of the external-connection electrodes $P_M$ of the high-frequency switch module 1 and corresponding ones of the ports $P_{IC}$ of the switch IC 10 are preferably defined by an internal electrode pattern and electrodes on the top and bottom surfaces of the multilayer circuit board.

The multilayer circuit board is preferably formed by laminating 21 dielectric layers. FIG. 2 is a lamination diagram of a multilayer circuit board formed by laminating 21 layers from a 1st layer at the top surface to a 21st layer at the bottom surface in ascending numeric order. Descriptions will be made below with these layer numbers. In FIG. 2, circles in each layer represent conductive via holes. With these via holes, electric connection between electrodes in layers arranged in a lamination direction is established.

On the top surface of the 1st layer corresponding to the top surface of the multilayer circuit board, a group of mount lands for the switch IC 10, the inductors Lm1, Lm2, Lm3, Lm4, and Ld, the capacitor Cm1, and the SAW filters SAW1, SAW2, SAW3, and SAW4, which are mount components, is formed. These mount components are mounted so that a predetermined positional relationship among them is satisfied. Since the inductors Lm1, Lm3, and Lm4 are mount components having a higher resistance to a current than that of inductors formed by electrode patterns in the multilayer circuit board and the element values of the inductors Lm1, Lm3, and Lm4 can be more easily selected, it is possible to improve the degree of freedom of selecting an inductor through which a current generated by electrostatic discharging at the time of switching passes.

The inductors Lm3 and Lm4 are disposed apart from the inductor Lm1, and other elements are disposed between the inductor Lm1 and each of the inductors Lm3 and Lm4. The inductors Lm3 and Lm4 are similarly disposed apart from the inductor Lm2, and other elements are similarly disposed between the inductor Lm2 and each of the inductors Lm3 and Lm4. As a result, the inductors Lm1 and Lm2 disposed on the side of the antenna port of the switch IC 10 are not electromagnetically coupled to the inductors Lm3 and Lm4 disposed on the side of the communication ports of the switch IC 10. This leads to a greater degree of isolation between an antenna port side of the switch IC 10 and a communication port side of the switch IC 10.

Furthermore, by disposing the inductors Lm1 and Lm2 apart from each other and disposing other elements between them, the electromagnetic field coupling between the inductors Lm1 and Lm2 can be prevented. Accordingly, even if a current passes through the inductor Lm1 at the time of switching, mutual induction does not occur at the inductor Lm2. This can prevent the occurrence of noise in the impedance matching circuit 20.

In the 2nd to 5th layers, various lead electrode patterns are formed.

In the 6th layer, a ground electrode GND is formed. In the 7th layer, lead electrode patterns are formed. The ground electrode GND is formed on a substantially entire surface of the 8th layer. The ground electrode GND formed in the 8th layer also functions as a counter electrode of the capacitors GCu1 and GCu3.

In the 9th layer, counter electrodes of the capacitors GCu1 and GCu3 are formed. In the 10th layer, only via holes are formed.

In the 11th, 12th, and 13th layers, electrode patterns forming the inductors GLt1, GLt2, DLt1, and DLt2 are formed. In the 14th layer, electrode patterns forming the inductors GLt1 and GLt2 are formed.

In the 15th, 16th, and 17th layers, only via holes are formed.

In the 18th layer, counter electrodes of the capacitors GCc1, GCc2, and DCc1 and the ground electrode GND are formed. The ground electrode GND formed in the 18th layer also functions as a counter electrode of the capacitor AC.

In the 19th layer, counter electrodes of the capacitors GCu2, GCu3, DCu2, DCu3, and AC are formed. The counter electrode of the capacitor GCu2 also functions as a counter electrode of the capacitors GCc1 and GCc2. The counter electrode of the DCu2 also functions as a counter electrode of the capacitor DCc1.

The ground electrode GND is formed on a substantially entire surface of the 20th layer. The ground electrode GND formed in the 20th layer also functions as a counter electrode of the capacitors GCu2, DCu2, DCu3, and AC. As illustrated in FIG. 2, by sandwiching the counter electrode of the capacitor AC in the 19th layer between the ground electrode GND in the 18th layer and the ground electrode GND in the 20th layer in the lamination direction, the coupling between the capacitor AC and another element can be prevented. As a result, the isolation between the capacitor AC and each circuit pattern on the side of the communication ports of the switch IC 10 formed in the multilayer circuit board can be established. It is therefore possible to prevent noise transmitted from an antenna to an impedance matching circuit to leak into each circuit on the side of the communication ports of the switch IC 10 included in the multilayer circuit board.

The external-connection electrodes $P_M$ are disposed along sides of the bottom surface of the 21st layer corresponding to the bottom surface of the multilayer circuit board. At the center of the layout pattern of the external-connection electrodes $P_M$, the ground electrode GND is provided. On the bottom surface, the external antenna electrode $P_M$(ANT0) is disposed along a side and the external reception electrodes $P_M$(Rx1), $P_M$(Rx2), $P_M$(Rx3), and $P_M$(Rx4) are disposed along an opposite side, so that isolation between the external antenna electrode $P_M$(ANT0) and each of the external reception electrodes $P_M$(Rx1), $P_M$(Rx2), $P_M$(Rx3), and $P_M$(Rx4) is established. Since electrodes adjacent to the external antenna electrode $P_M$(ANT0) disposed along a side are the ground electrodes GND, isolation between the external antenna electrode $P_M$(ANT0) and each external-connection electrode $P_M$ is established.

A high-frequency switch module having the above-described configuration has an excellent transmission characteristic and an ESD protection function and can achieve a high switching speed and size reduction.

Figure 3:
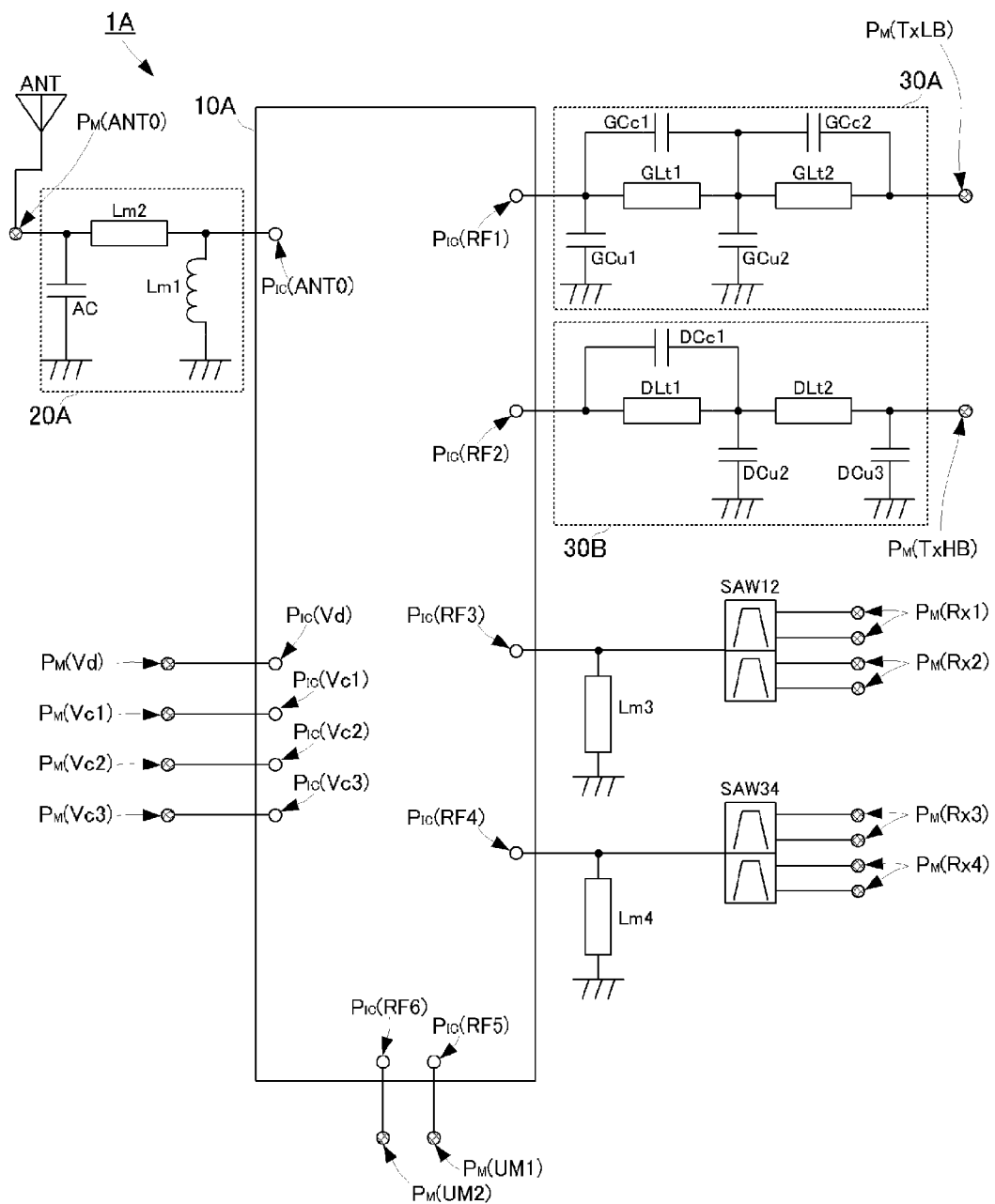
FIG. 3 is a circuit diagram of a high-frequency switch module according to a second preferred embodiment of the present invention.
Figure 4:
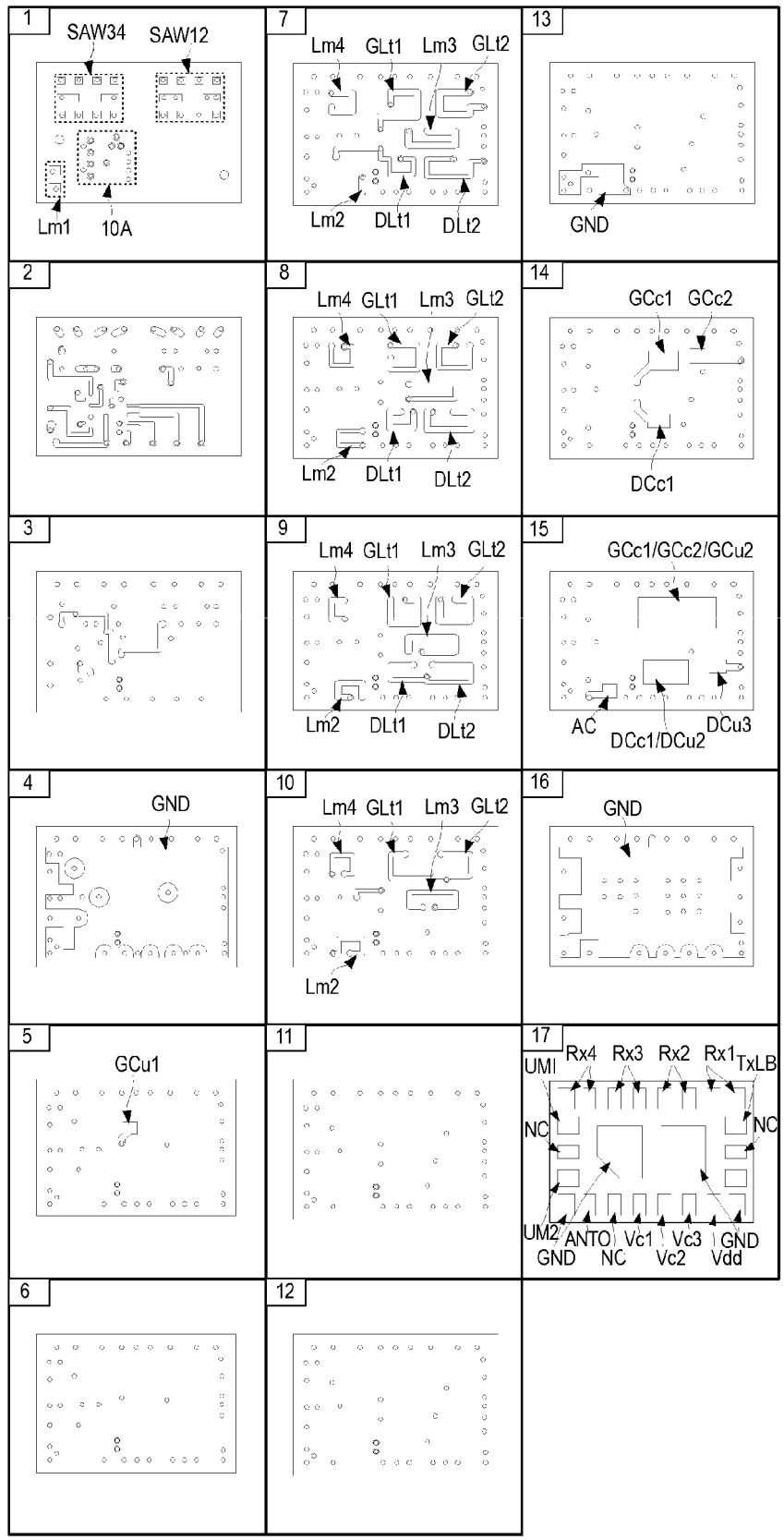
FIG. 4 is a lamination diagram of a high-frequency switch module according to the second preferred embodiment of the present invention.

Next, a high-frequency switch module according to a second preferred embodiment of the present invention will be described with reference to the accompanying drawings. FIG. 3 is a circuit diagram of a high-frequency switch module 1A according to the second preferred embodiment. FIG. 4 is a lamination diagram of a multilayer circuit board in the high-frequency switch module 1A.

A multilayer circuit board in the high-frequency switch module 1A, whose configuration will be described in detail later with reference to FIG. 4, is formed by a stack of a plurality of dielectric layers made of ceramic or a resin. Circuit patterns other than a switch IC 10A, the inductor Lm1, and SAW filters SAW12 and SAW34 in the high-frequency switch module 1A illustrated in FIG. 3 are created by forming electrodes of predetermined patterns in inner layers between the dielectric layers and the top and bottom surfaces of the stack.

The high-frequency switch module 1A has a plurality of external-connection electrodes $P_M$. The external-connection electrodes $P_M$ include the external antenna electrode $P_M$(ANT0), the external transmission electrodes $P_M$(TxLB) and $P_M$(TxHB), the external reception electrodes $P_M$(Rx1), $P_M$(Rx2), $P_M$(Rx3), and $P_M$(Rx4), the external transmission/reception electrodes $P_M$(UM1) and $P_M$(UM2), the external drive voltage input electrode $P_M$(Vd) for inputting a drive voltage, and the external control voltage input electrodes $P_M$(Vc1), $P_M$(Vc2), and $P_M$(Vc3) for inputting a control voltage signal. Although not illustrated in FIG. 3, the external-connection electrodes $P_M$ also include a ground electrode. Each of the external reception electrodes $P_M$(Rx1), $P_M$(Rx2), $P_M$(Rx3), and $P_M$(Rx4) is preferably defined by a balanced electrode composed of a pair of electrodes.

First, the configuration of the high-frequency switch module 1A between an antenna and the switch IC 10A will be described.

The antenna port $P_{IC}$(ANT0) of the switch IC 10A is connected via an impedance matching circuit 20A to the external antenna electrode $P_M$(ANT0) connected to the antenna ANT in the high-frequency switch module 1A.

The impedance matching circuit 20A includes the inductors Lm1 and Lm2 and the capacitor AC. The inductor Lm2 is connected in series between the external antenna electrode $P_M$(ANT0) and the antenna port $P_{IC}$(ANT0.) One end of the inductor Lm1 is connected to the antenna port $P_{IC}$(ANT0), and the other end of the inductor Lm1 is connected to the ground. One end of the capacitor AC is connected to the external antenna electrode $P_M$(ANT0), and the other end of the capacitor AC is connected to the ground. The impedance matching circuit 20A having the above-described configuration can obtain an operational effect similar to that obtained by the impedance matching circuit 20 according to the first preferred embodiment.

Next, the configuration of the switch IC 10A will be described. The switch IC 10A has, for example, a CMOS structure, and is an SP6T-type FET switch IC that is substantially rectangular in plan view. The switch IC 10A is driven by the drive voltage Vdd, and has a function of selectively connecting the antenna port $P_{IC}$(ANT0) corresponding to a common terminal according to a preferred embodiment of the present invention to one of the communication ports $P_{IC}$(RF1) to $P_{IC}$(RF6) corresponding to high-frequency signal input/output terminals according to a preferred embodiment of the present invention in accordance with the combination of the control voltage signals Vc1 to Vc3.

Next, the circuit configuration of the high-frequency switch module 1A on the opposite side of the antenna, that is, on the side of the communication ports of the switch IC 10A corresponding to high-frequency signal input/output terminals according to a preferred embodiment of the present invention will be described. The transmission circuit configuration of the high-frequency switch module 1A is the same as that of the high-frequency switch module 1 according to the first preferred embodiment except for that the capacitor GCu3 is not included in the low-pass filter 30A, and the description given in the first preferred embodiment will be therefore omitted.

The communication port $P_{IC}$(RF3) of the switch IC 10A is connected to the external reception electrodes $P_M$(Rx1) and $P_M$(Rx2) via the SAW filter SAW12 in the high-frequency switch module 1A. The SAW filter SAW12 is a filter having the first and second reception frequency bands as a passband. For example, the frequency bands of a GSM-850 reception signal and a GSM-900 reception signal are set as a passband of the SAW filter SAW12. The connection of the SAW filter SAW12 is performed so that a signal in the first reception frequency band (a GSM-850 reception signal) is output to the external reception electrode $P_M$(Rx1) and a signal in the second reception frequency band (a GSM-900 reception signal) is output to the external reception electrode $P_M(Rx2)$.

The communication port $P_{IC}(RF3)$ of the switch IC 10A is also connected to the ground by the inductor Lm3.

The communication port $P_{IC}(RF4)$ of the switch IC 10A is connected to the external reception electrodes $P_M(Rx3)$ and $P_M(Rx4)$ via the SAW filter SAW34 in the high-frequency switch module 1A. The SAW filter SAW34 is a filter having the third and fourth reception frequency bands as a passband. For example, the frequency bands of a GSM-1800 reception signal and a GSM-1900 reception signal are set as a passband of the SAW filter SAW34. The connection of the SAW filter SAW34 is performed so that a signal in the third reception frequency band (a GSM-1800 reception signal) is output to the external reception electrode $P_M(Rx3)$ and a signal in the fourth reception frequency band (a GSM-1900 reception signal) is output to the external reception electrode $P_M(Rx4)$.

The communication port $P_{IC}(RF4)$ of the switch IC 10A is also connected to the ground by the inductor Lm4.

The high-frequency switch module 1A having the above-described reception configuration can obtain an operational effect similar to that obtained by the high-frequency switch module 1 according to the first preferred embodiment.

The communication ports $P_{IC}(RF5)$ and $P_{IC}(RF6)$ of the switch IC 10A are connected to the external transmission/reception electrodes $P_M(UM1)$ and $P_M(UM2)$, respectively, in the high-frequency switch module 1A.

The drive voltage input port $P_{IC}(Vd)$ of the switch IC 10A is connected to the external drive voltage input electrode $P_M(Vd)$ in the high-frequency switch module 1A.

The control voltage input ports $P_{IC}(Vc1)$, $P_{IC}(Vc2)$, and $P_{IC}(Vc3)$ of the switch IC 10A are connected to the external control voltage input electrodes $P_M(Vc1)$, $P_M(Vc2)$, and $P_M(Vc3)$, respectively, in the high-frequency switch module 1A.

Next, the lamination configuration of a multilayer circuit board in the high-frequency switch module 1A will be described in detail below with reference to FIG. 4.

In a multilayer circuit board in the high-frequency switch module 1A, the low-pass filters 30A and 30B, the inductor Lm2 and the capacitor AC which are included in the impedance matching circuit 20A, and the inductors Lm3 and Lm4 are preferably defined by internal electrode patterns. Other circuit elements are preferably defined by other circuit elements mounted on the surface of the multilayer circuit board. A circuit pattern arranged to connect these circuit elements and a circuit pattern arranged to connect each of the external-connection electrodes $P_M$ of the high-frequency switch module 1A and corresponding one of the ports $P_{IC}$ of the switch IC 10A are preferably defined by an internal electrode pattern and electrodes on the top and bottom surfaces of the multilayer circuit board.

The multilayer circuit board is preferably formed by laminating 17 dielectric layers. FIG. 4 is a lamination diagram of a multilayer circuit board formed by laminating 17 layers from a 1st layer at the top surface to a 17th layer at the bottom surface in ascending numeric order. Descriptions will be made below with these layer numbers. In FIG. 4, circles in each layer represent conductive via holes. With these via holes, electric connection between electrodes in layers arranged in a lamination direction is established.

On the top surface of the 1st layer corresponding to the top surface of the multilayer circuit board, a group of mount lands for the switch IC 10A, the inductor Lm1, and the SAW filters SAW12 and SAW34, which are mount components, is formed. These mount components are mounted so that a predetermined positional relationship among them is satisfied.

In the 2nd and 3rd layers, various lead electrode patterns are formed.

The ground electrode GND is formed on a substantially entire surface of the 4th layer. The ground electrode GND formed in the 4th layer also functions as a counter electrode of the capacitor GCu1.

In the 5th layer, the counter electrode of the capacitor GCu1 is formed. In the 6th layer, only via holes are formed.

In the 7th, 8th, and 9th layers, electrode patterns forming the inductors GLt1, GLt2, DLt1, DLt2, Lm2, Lm3, and Lm4 are formed. In the 10th layer, electrode patterns forming the inductors GLt1, GLt2, Lm2, Lm3, and Lm4 are formed.

In the 11th and 12th layers, only via holes are formed. In the 13th layer, the ground electrode GND is formed. The ground electrode GND formed in the 13th layer also functions as a counter electrode of the capacitor AC. The ground electrode GND formed in the 13th layer is formed so that it overlaps the inductor Lm2 in a plan view of the multilayer circuit board (as viewed along the lamination direction.) As a result, the ground electrode GND and the inductor Lm2 are capacitively coupled to each other to generate a capacitance. The generated capacitance can be used for fine control of impedance matching performed by the impedance matching circuit 20A.

In the 14th layer, counter electrodes of the capacitors GCc1, GCc2, and DCc1 are formed.

In the 15th layer, counter electrodes of the capacitors GCu2, DCu2, DCu3, and AC are formed. The counter electrode of the capacitor GCu2 also functions as a counter electrode of the capacitors GCc1 and GCc2. The counter electrode of the capacitor DCu2 also functions as a counter electrode of the capacitor DCc1. As illustrated in FIG. 4, by sandwiching the counter electrode of the capacitor AC in the 15th layer between the ground electrode GND in the 13th layer and the ground electrode GND in the 16th layer in the lamination direction, the coupling between the capacitor AC and another element can be prevented like in the first preferred embodiment.

The external-connection electrodes $P_M$ are disposed along sides of the bottom surface of the 17th layer corresponding to the bottom surface of the multilayer circuit board. At the center of the layout pattern of the external-connection electrodes $P_M$, the ground electrodes GND are provided. On the bottom surface, the external antenna electrode $P_M(ANT0)$ is disposed along a side and the external reception electrodes $P_M(Rx1)$, $P_M(Rx2)$, $P_M(Rx3)$, and $P_M(Rx4)$ are disposed along an opposite side, so that isolation between the external antenna electrode $P_M(ANT0)$ and each of the external reception electrodes $P_M(Rx1)$, $P_M(Rx2)$, $P_M(Rx3)$, and $P_M(Rx4)$ is established.

Like the high-frequency switch module 1 according to the first preferred embodiment, a high-frequency switch module having the above-described configuration has an excellent transmission characteristic and an ESD protection function and can achieve a high switching speed and size reduction.

Figure 5:
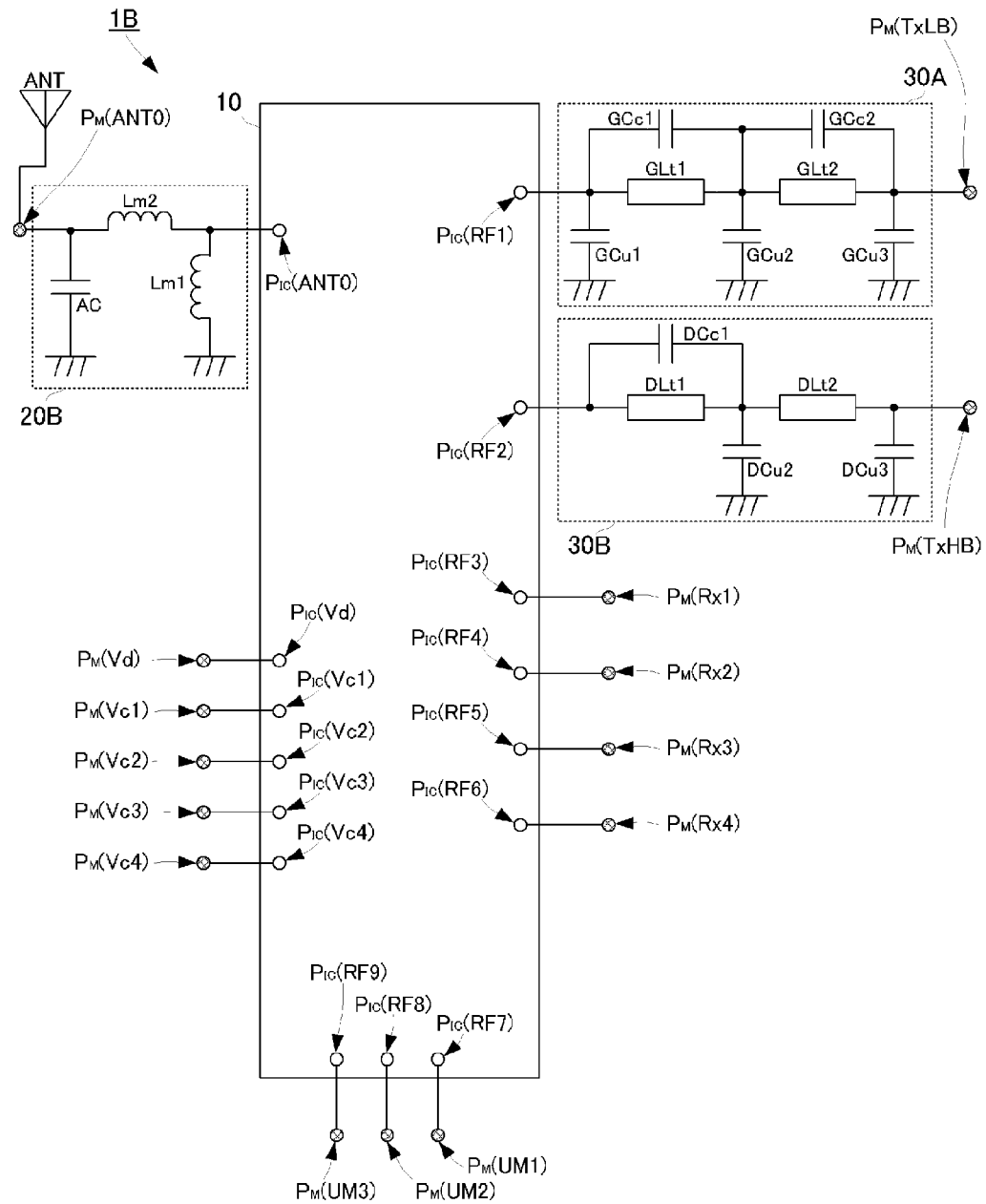
FIG. 5 is a circuit diagram of a high-frequency switch module according to a third preferred embodiment of the present invention.
Figure 6:
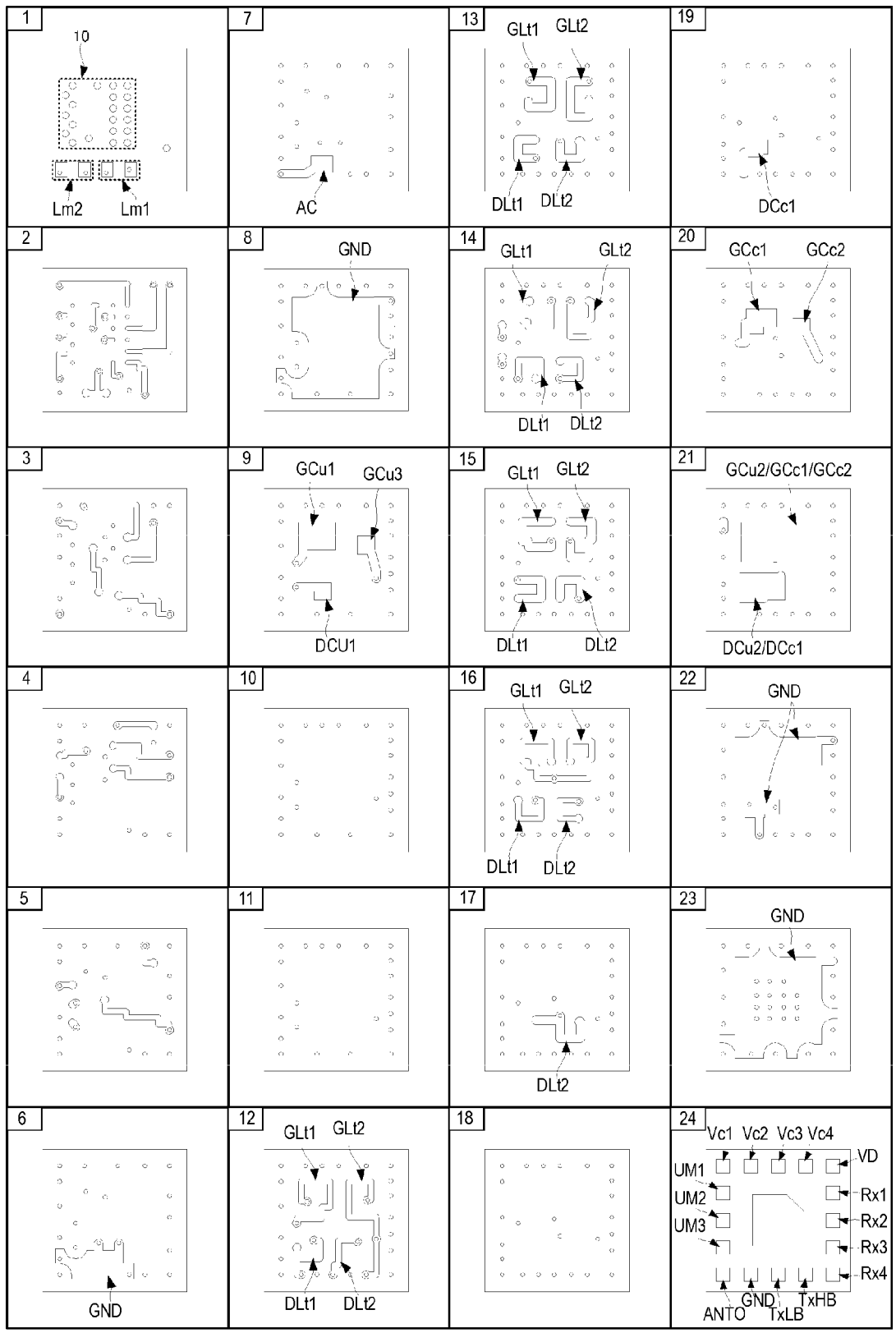
FIG. 6 is a lamination diagram of a high-frequency switch module according to the third preferred embodiment of the present invention.

Next, a high-frequency switch module according to a third preferred embodiment of the present invention will be described with reference to the accompanying drawings. FIG. 5 is a circuit diagram of a high-frequency switch module 1B according to the third preferred embodiment. FIG. 6 is a lamination diagram of a multilayer circuit board in the high-frequency switch module 1B.

The configuration of the high-frequency switch module 1B is preferably the same as that of the high-frequency switch module 1 according to the first preferred embodiment except for the configuration of an impedance matching circuit 20B and a reception circuit configuration on the side of the communication ports $P_{IC}$(RF3) to $P_{IC}$(RF6) of the switch IC 10, and the description given in the first preferred embodiment will be therefore omitted.

The circuit configuration of the impedance matching circuit 20B is the same as that of the impedance matching circuit 20A according to the second preferred embodiment, and includes the inductors Lm1 and Lm2 and the capacitor AC. The inductor Lm2 is connected in series between the external antenna electrode $P_M$(ANT0) and the antenna port $P_{IC}$(ANT0.) One end of the inductor Lm1 is connected to the antenna port $P_{IC}$(ANT0), and the other end of the inductor Lm1 is connected to the ground. One end of the capacitor AC is connected to the external antenna electrode $P_M$(ANT0), and the other end of the capacitor AC is connected to the ground. The impedance matching circuit 20B having the above-described configuration can obtain an operational effect similar to that obtained by the impedance matching circuit 20 according to the first preferred embodiment and the impedance matching circuit 20A according to the second preferred embodiment.

The communication ports $P_{IC}$(RF3), $P_{IC}$(RF4), $P_{IC}$(RF5), and $P_{IC}$(RF6) of the switch IC 10 are directly connected to the external reception electrodes $P_M$(Rx1), $P_M$(Rx2), $P_M$(Rx3), and $P_M$(Rx4), respectively, in the high-frequency switch module 1B. In this case, since a reception circuit is disposed on a circuit board at the subsequent stage, the size of a high-frequency switch module can be further reduced. Furthermore, a designer of a circuit board of an electronic apparatus including the high-frequency switch module 1B can freely design a reception circuit configuration.

Next, the lamination configuration of a multilayer circuit board in the high-frequency switch module 1B will be described in detail below with reference to FIG. 6.

In a multilayer circuit board in the high-frequency switch module 1B, the low-pass filters 30A and 30B and the capacitor AC included in the impedance matching circuit 20B are preferably defined by internal electrode patterns. Other circuit elements are preferably defined by other circuit elements mounted on the surface of the multilayer circuit board. A circuit pattern arranged to connect these circuit elements and a circuit pattern arranged to connect each of the external-connection electrodes $P_M$ of the high-frequency switch module 1B and corresponding one of the ports $P_{IC}$ of the switch IC 10 are preferably defined by an internal electrode pattern and electrodes on the top and bottom surfaces of the multilayer circuit board.

The multilayer circuit board is preferably formed by laminating 24 dielectric layers. FIG. 6 is a lamination diagram of a multilayer circuit board formed by laminating 24 layers from a 1st layer at the top surface to a 24th layer at the bottom surface in ascending numeric order. Descriptions will be made below with these layer numbers. In FIG. 6, circles in each layer represent conductive via holes. With these via holes, electric connection between electrodes in layers arranged in a lamination direction is established.

On the top surface of the 1st layer corresponding to the top surface of the multilayer circuit board, a group of mount lands for the switch IC 10 and the inductors Lm1 and Lm2, which are mount components, is formed. These mount components are mounted so that a predetermined positional relationship among them is satisfied.

In the 2nd to 5th layers, various lead electrode patterns are formed.

In the 6th layer, the ground electrode GND is formed. The ground electrode GND formed in the 6th layer also functions as a counter electrode of the capacitor AC. In the 7th layer, the counter electrode of the capacitor AC is formed so that it overlaps the ground electrode GND formed in the 6th layer in a plan view of the multilayer circuit board. The ground electrode GND is formed on a substantially entire surface of the 8th layer so that the ground electrode GND covers an area of the 7th layer in which the counter electrode of the capacitor AC is formed. The ground electrode GND in the 8th layer functions not only as the counter electrode of the capacitor AC but also as a counter electrode of the capacitors GCu1, GCu3, and DCu1 in relation to the 9th layer.

As illustrated in FIG. 6, by sandwiching the counter electrode of the capacitor AC in the 7th layer between the ground electrode GND in the 6th layer and the ground electrode GND in the 8th layer in the lamination direction, the coupling between the capacitor AC and another element can be prevented like in the first and second preferred embodiments. Furthermore, in this preferred embodiment, since only the counter electrode of the capacitor AC is formed in the 7th layer, the coupling between the capacitor AC and another element in the 7th layer can also be prevented.

In the 9th layer, counter electrodes of the capacitors GCu1, GCu3, and DCu1 are formed. In the 10th and 11th layers, only via holes are formed.

In the 12th to 16th layers, electrode patterns forming the inductors GLt1, GLt2, DLt1, and DLt2 are formed. In the 17th layer, an electrode pattern forming the inductor DLt2 is formed. In the 18th layer, only via holes are formed.

In the 20th layer, counter electrodes of the capacitors GCc1 and GCc2 are formed. In the 21st layer, counter electrodes of the capacitors GCu2 and DCu2 are formed. The counter electrode of the capacitor GCu2 formed in the 21st layer also functions as a counter electrode of the capacitors GCc1 and GCc2. The counter electrode of the capacitor DCu2 formed in the 21st layer also functions as a counter electrode of the capacitor DCc1.

In the 22nd layer, the ground electrode GND is formed. The ground electrode GND formed in the 22nd layer also functions as a counter electrode of the capacitors GCu2 and DCu2. The ground electrode GND is formed on a substantially entire surface of the 23rd layer in a plan view of the multilayer circuit board (as viewed along the lamination direction.)

The external-connection electrodes $P_M$ are disposed along sides of the bottom surface of the 24th layer corresponding to the bottom surface of the multilayer circuit board. At the center of the layout pattern of the external-connection electrodes $P_M$, the ground electrode GND is provided.

In the third preferred embodiment, like in the first and second preferred embodiments, various problems that occur in a circuit between an antenna and a switch IC can be solved.

Figure 7:
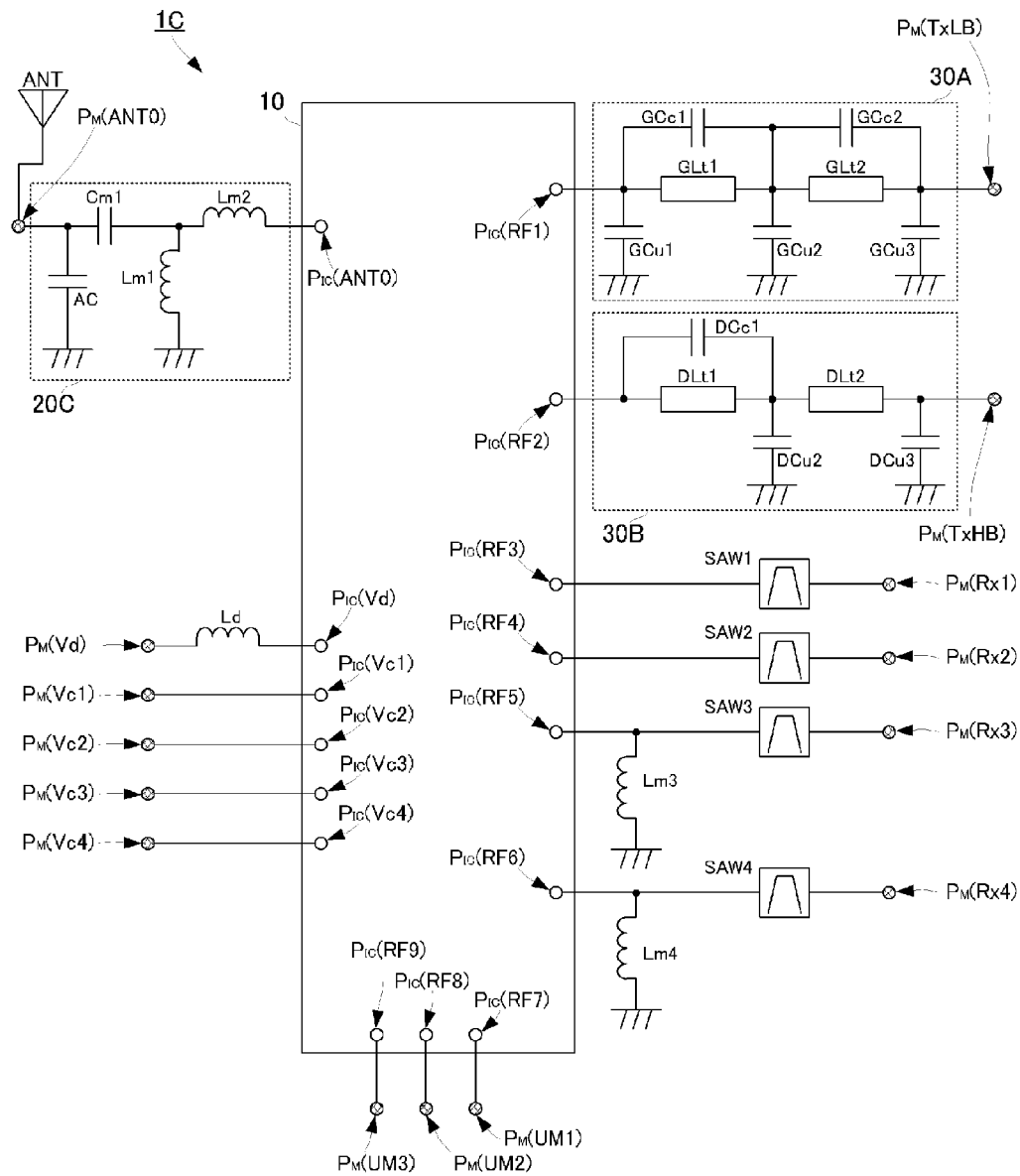
FIG. 7 is a circuit diagram of a high-frequency switch module according to a fourth preferred embodiment of the present invention.

Next, a high-frequency switch module according to a fourth preferred embodiment of the present invention will be described with reference to the accompanying drawing. FIG. 7 is a circuit diagram of a high-frequency switch module 1C according to the fourth preferred embodiment.

The configuration of the high-frequency switch module 1C is preferably the same as that of the high-frequency switch module 1 according to the first preferred embodiment except for the circuit configuration of an impedance matching circuit 20C. Accordingly, only the impedance matching circuit 20C will be described below.

The impedance matching circuit 20C includes the inductors Lm1 and Lm2 and the capacitors Cm1 and AC.

The capacitor Cm1 and the inductor Lm2 are connected in series between the external antenna electrode $P_M$(ANT0) and the antenna port $P_{IC}$(ANT0.) The capacitor Cm1 and the inductor Lm2 are arranged so that the inductor Lm2 is connected to the antenna port $P_{IC}$(ANT0), that is, the switch IC 10.

One end of the inductor Lm1 is connected to a node between the inductor Lm2 and the capacitor Cm1, and the other end of the inductor Lm1 is connected to the ground. One end of the capacitor AC is connected to the external antenna electrode $P_M$(ANT0), and the other end of the capacitor AC is connected to the ground.

The antenna port $P_{IC}$(ANT0) of the switch IC 10 is connected to the ground via the series circuit of the inductors Lm1 and Lm2, that is, via only inductors. As a result, the impedance matching circuit 20C can obtain an operational effect similar to that obtained by the impedance matching circuit 20 according to the first preferred embodiment and the impedance matching circuit 20A according to the second preferred embodiment.

An exemplary configuration of a high-frequency switch module according to each preferred embodiment has been described. However, any high-frequency switch module having a circuit configuration in which the antenna port $P_{IC}$(ANT0) of a switch IC is connected to the ground via only an inductor included in an impedance matching circuit connected to the antenna port $P_{IC}$(ANT0) of the switch IC.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency switch module comprising:
   a switch IC including a common terminal connected to a single antenna and a plurality of high-frequency signal input/output terminals that are individually connected to a plurality of high-frequency communication circuits;
   a first inductor arranged to directly connect the common terminal of the switch IC to a ground;
   an impedance matching circuit disposed between the common terminal of the switch IC and the antenna and arranged to perform impedance matching between the switch IC and the antenna; and
   a multilayer circuit board in which the switch IC is included and a circuit element included in the impedance matching circuit includes an internal electrode or a mounted electronic circuit component; wherein
   the first inductor is disposed at one end portion of the impedance matching circuit on a side of the common terminal;
   one end portion of the first inductor on a side of the ground is connected to a ground electrode disposed on an inner layer or undersurface of the multilayer circuit board through only via holes formed in the multilayer circuit board; and
   the first inductor is arranged in the multilayer circuit board so as not to overlap any other inductors disposed in the multilayer circuit board when viewed in a plan view of the multilayer circuit board.

2. The high-frequency switch module according to claim 1, further comprising a second inductor arranged to directly connect at least one of the plurality of high-frequency signal input/output terminals to the ground.

3. The high-frequency switch module according to claim 2, wherein one end portion of the second inductor on a side of the ground is connected to the ground electrode through only the via holes formed in the multilayer circuit board.

4. The high-frequency switch module according to claim 3, wherein the second inductor is mounted on a surface of the multilayer circuit board.

5. The high-frequency switch module according to claim 4, wherein the first inductor is mounted on the surface of the multilayer circuit board, and other circuit elements included in the high-frequency switch module are disposed between the first inductor and the second inductor on the surface of the multilayer circuit board.

6. The high-frequency switch module according to claim 1, wherein
   the impedance matching circuit includes a band-pass filter including a low-pass filter and a high-pass filter; and
   the first inductor is included in the high-pass filter.

7. The high-frequency switch module according to claim 1, wherein the impedance matching circuit includes a capacitor having one end portion connected to the ground, and a counter electrode of the capacitor is sandwiched between two ground electrodes included in the multilayer circuit board in a lamination direction.

* * * * *